US010466326B2

United States Patent
Sillerud

(10) Patent No.: US 10,466,326 B2
(45) Date of Patent: Nov. 5, 2019

(54) QUANTITATIVE [FE]-MRI (FEMRI) OF ANTI-PSMA-CONJUGATED SPIONS BASED ON PSMA EXPRESSION LEVELS

(71) Applicant: STC.UNM, Albuquerque, NM (US)

(72) Inventor: Laurel Sillerud, Albuquerque, NM (US)

(73) Assignee: STC. UNM, Albuquerque, NM (US)

( * ) Notice: Subject to any disclaimer, the term of this patent is extended or adjusted under 35 U.S.C. 154(b) by 167 days.

(21) Appl. No.: 15/574,431

(22) PCT Filed: May 13, 2016

(86) PCT No.: PCT/US2016/032489
§ 371 (c)(1),
(2) Date: Nov. 15, 2017

(87) PCT Pub. No.: WO2016/187052
PCT Pub. Date: Nov. 24, 2016

(65) Prior Publication Data
US 2018/0143278 A1 May 24, 2018

Related U.S. Application Data

(60) Provisional application No. 62/161,973, filed on May 15, 2015.

(51) Int. Cl.
G01R 33/56 (2006.01)
G01R 33/465 (2006.01)
(Continued)

(52) U.S. Cl.
CPC .......... *G01R 33/5602* (2013.01); *B82Y 15/00* (2013.01); *G01R 33/465* (2013.01);
(Continued)

(58) Field of Classification Search
None
See application file for complete search history.

(56) References Cited

U.S. PATENT DOCUMENTS 5,561,369 A * 10/1996 Feinberg ................ G01R 33/50
324/307
5,855,868 A * 1/1999 Fahlvik .............. A61K 49/1863
424/9.322

(Continued)

FOREIGN PATENT DOCUMENTS

| RU | 2343828 C2 | 1/2009 |
|----|------------|--------|
| WO | 2009/031859 A2 | 3/2009 |
| WO | 2012/177875 A1 | 12/2012 |

OTHER PUBLICATIONS

Federal Institute of Industrail Property; International Search Report & Written Opinion for PCT/US2016/032489; dated May 13, 2016; 6 pages; Moscow, RU.

Primary Examiner — Jermele M Hollington
(74) Attorney, Agent, or Firm — Keith Vogt, Ltd.; Keith A. Vogt

(57) ABSTRACT

A method of measuring the concentration of a magnetic material in an object using magnetic resonance imaging comprising administering magnetic material to the object; obtaining a set of $T_1$-weighted and $T_2$-weighted images of the object in order to determine a background magnetic resonance imaging signal intensity and measurements of the background nuclear magnetic relaxation times ($T_1$, $T_2$) of the object without magnetic material; and obtaining a set of $T_1$-weighted and $T_2$-weighted magnetic resonance images of the object with magnetic materials added; measuring effect of magnetic material on the relaxation times; and converting the $T_1$-weighted and $T_2$-weighted images into a set of contrast images which are subtracted from each other to (Continued)

yield a contrast difference image proportional to the concentration of the magnetic material.

21 Claims, 9 Drawing Sheets

(51) Int. Cl.
*B82Y 15/00* (2011.01)
*G06T 7/00* (2017.01)
(52) U.S. Cl.
CPC ..... *G01R 33/5601* (2013.01); *G01R 33/5608* (2013.01); *G06T 7/0016* (2013.01); *G06K 2209/05* (2013.01); *G06T 2207/10088* (2013.01); *G06T 2207/30004* (2013.01)

(56) References Cited

U.S. PATENT DOCUMENTS

| | | | |
|---|---|---|---|
| 6,605,943 B1 * | 8/2003 | Clark | G01R 33/50 324/309 |
| 8,116,546 B2 | 2/2012 | Degani et al. | |
| 9,223,000 B2 * | 12/2015 | Grodzki | G01R 33/4816 |
| 9,547,942 B2 * | 1/2017 | Voigt | G06T 7/0012 |

* cited by examiner

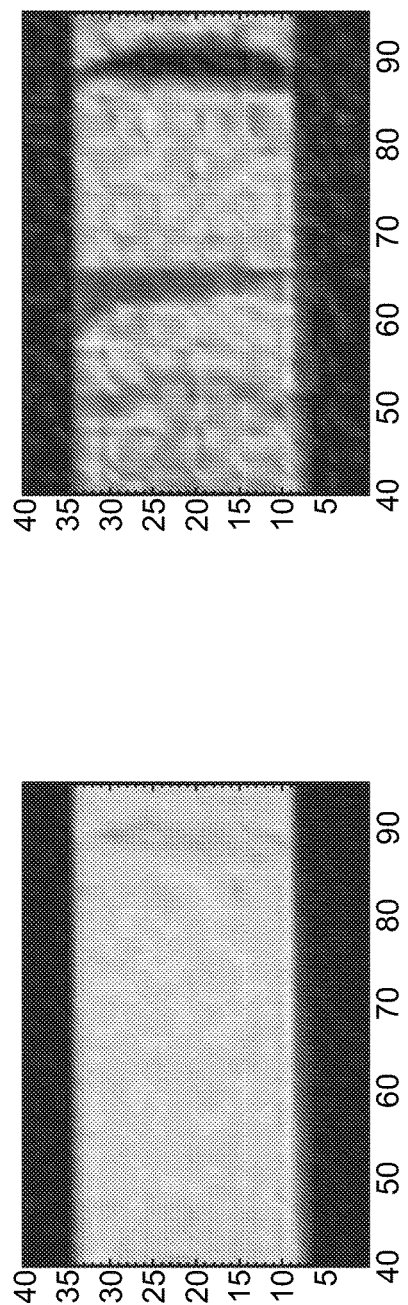
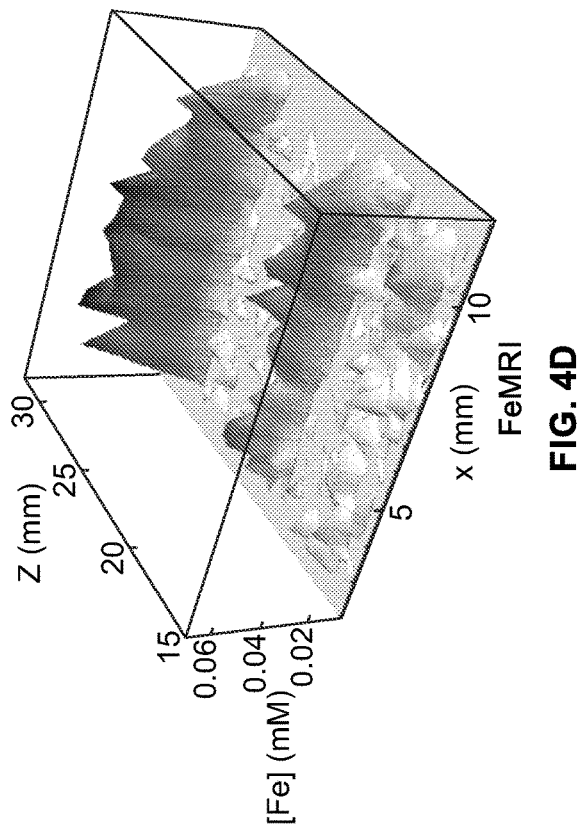
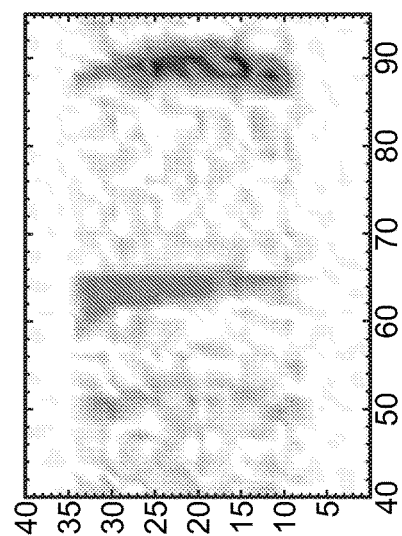
FIG. 4A  T₁w
FIG. 4B  T₂w
FIG. 4C  FeMRI
FIG. 4D  FeMRI

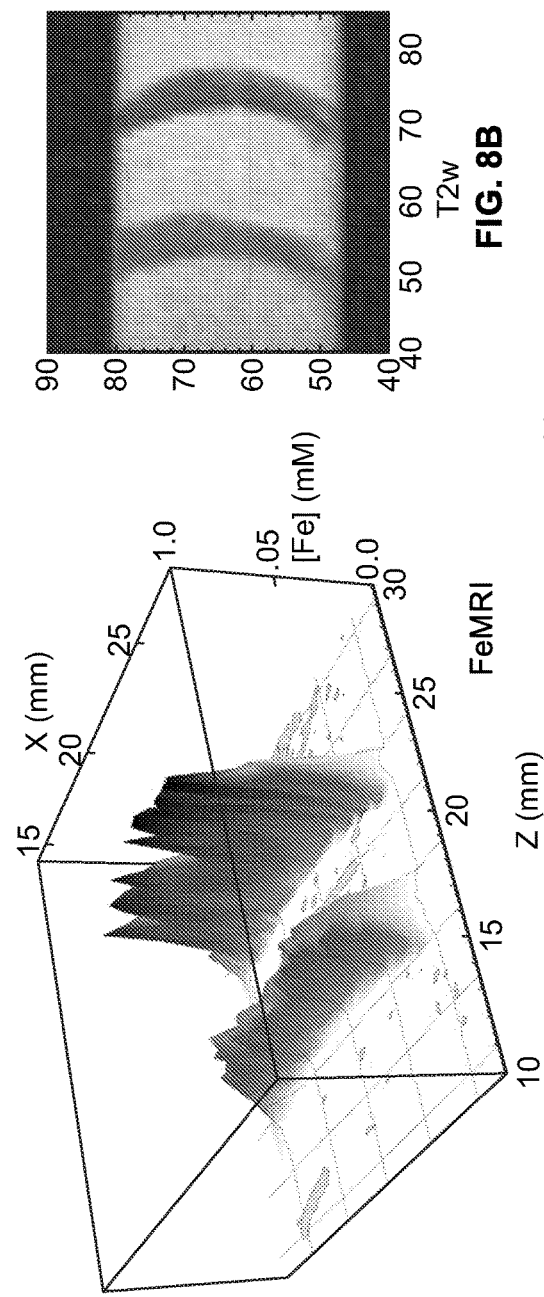
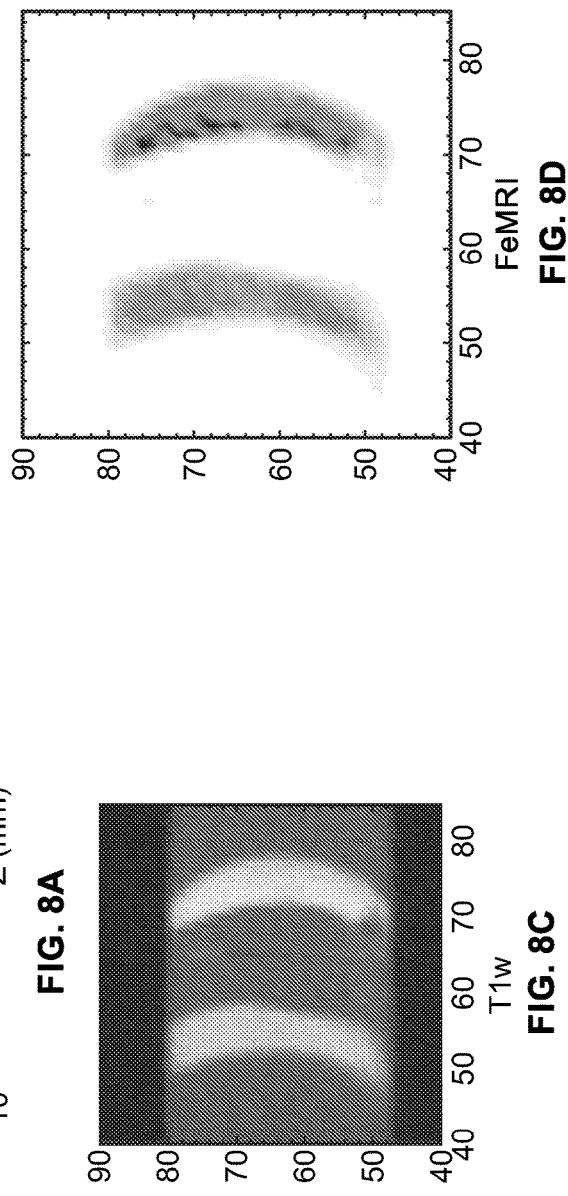
FIG. 8A
FIG. 8B
FIG. 8C
FIG. 8D

QUANTITATIVE [FE]-MRI (FEMRI) OF ANTI-PSMA-CONJUGATED SPIONS BASED ON PSMA EXPRESSION LEVELS

RELATED APPLICATIONS

This application claims the benefit of U.S. Provisional Application No. 62/161,973 filed May 15, 2015 and herein incorporated by reference.

STATEMENT REGARDING FEDERALLY SPONSORED RESEARCH & DEVELOPMENT

This invention was made with government support under grant no. L.O.S. (NIH 5 R01 CA123194), awarded by National Cancer Institute The government has certain rights in the invention.

BACKGROUND OF THE INVENTION

A goal of molecular imaging is to produce quantitative maps of the distribution of a particular tracer or endogenous substance with the resolution characteristic of the chosen method of detection. For this to be accomplished, a quantitative relationship must exist between an image parameter and the imaging agent's concentration. Magnetic resonance imaging (MRI) has been successful in medicine due to the richness of the set of spin manipulations that introduce specific contrast variations in tissue.

The range of applications of MRI has been expanded through the discovery and usage of agents that introduce image contrast via perturbations of the magnetic relaxation rates of nearby nuclei. MRI contrast is a complex, non-linear function of the concentration of contrast agents on nuclear relaxation rates. However, as long as these non-linearities give rise to single-valued, monotonic dependences of contrast on the agent concentration, it is possible to anticipate these nonlinear effects through theory and then to use these relationships to measure the concentration of a given contrast agent in a particular imaging slice.

A useful class of MRI contrast agents, that may be used with the present invention, is comprised of superparamagnetic iron oxide nanoparticles (SPIONs) which are widely used as complexes containing, in addition to the iron oxide core, one or more recognition ligands, such as antibodies, peptides, aptamers, or small molecules. These recognition ligands confer binding specificity on the interaction between the SPION and a target epitope in the tissue. SPION nanoparticles may be constructed which are loaded with therapeutic molecules such as drugs, microRNAs, or enzymes, in order to exploit their specific interactions with target cells.

In this manner, SPIONs as well as other contrast agents, become both diagnostic and therapeutic by being able to accurately determine their concentrations in the target tissues. For example, one of the primary impediments to the treatment of primary or metastatic brain tumors is that most chemotherapeutic antitumor drugs do not cross the blood-brain barrier in sufficient quantity to achieve a therapeutic concentration in the brain parenchyma. This problem is further confounded by the dearth of facile, non-invasive methods for determining the actual, in vivo drug concentrations in tissues.

In addition, using knowledge of cell surface receptor density for the particle-targets, one may be able to determine, for example, the number of tumor or other cells (such as macrophages) in a measured volume from the iron concentration measurements. The MRI signal perturbation by the SPIONs, as well as other contrast agents, properly understood, would then serve as a reporter for the ligand's epitope density. Current MRI in humans enjoys submillimeter resolution so that tumor burden could be measured with good accuracy by these means. The time-dependent movement and transport of nanoparticles could also be determined because repeated MR images are essentially harmless and well-tolerated by people.

Since SPIONs are observable using MRI, an MRI method for measuring the concentration of nanoparticles in tissues would provide a solution for many of these important problems, because, if one knew the easily-measured relationship between drug and iron concentrations in the SPIONs, the measurement of the [Fe] in the tissue would become a surrogate for the [drug].

SUMMARY OF THE INVENTION

In one embodiment, the present invention provides a method of measuring the concentration of a magnetic material in an object using MRI comprising the steps of: administering magnetic material to an object; obtaining a first set which may be a plurality or a pair of $T_1$-weighted and $T_2$-weighted images of the object in order to determine a background MRI signal intensity and measurements of the background nuclear magnetic relaxation times ($T_1$, $T_2$) of the object without magnetic material; and obtaining a set which may be a plurality or a pair of $T_1$-weighted and $T_2$-weighted MR images of the object with magnetic materials added; measuring the effect of the magnetic material on the relaxation times; and converting the sets of images into a set which may be a plurality or a pair of contrast images which are subtracted from each other to yield a contrast difference image proportional to the concentration of the magnetic material.

In another embodiment, the present invention provides a method of measuring the concentration of a magnetic material in an object using MRI comprising the steps of: obtaining a first set which may be a plurality or a pair of $T_1$-weighted and $T_2$-weighted images of the object in order to determine a background MRI signal intensity and measurements of the background nuclear magnetic relaxation times ($T_1$, $T_2$) of the object without magnetic material; administering magnetic material to the object; obtaining a second set which may be a plurality or a pair of $T_1$-weighted and $T_2$-weighted MR images of the object with magnetic materials added; and converting the second sets which may be a plurality or a pair of images into a pair of contrast images which are subtracted from each other to yield a contrast difference image proportional to the concentration of the magnetic material.

1. In other embodiments, the present invention may be used to measure the concentration of any magnetic particle in an MRI compatible object, i.e., an object that is not magnetic including gels, concrete, plastics, and carbon fibers. In addition, the present invention may be used to conduct non-destructive testing. Other contrast agents or magnetic materials that may be used with the present invention include magnetic compounds, magnetic elements, magnetic molecules, and magnetic nanoparticles. Other contrast agents or magnetic materials include any of the rare earth magnetic materials such as lanthanides, metals, transition metals and the like. Yet other contrast materials may include iron, nickel, manganese, chromium, gallium, or a lanthanide.

In other embodiments, the present invention has applications in detecting other cells and other biological substances of interest including pancreatic cancer cells, macrophages and the like.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

FIG. 4A, FIG. 4B, FIG. 4C, and FIG. 4D illustrate the determination of the limit of detection for iron using FeMRI at 1.0 T. A dynabead stock solution was diluted 1:6250, 1:1250, and 1:250 into 1% agarose and placed into 10 mm plastic tubes as bands surrounded by agarose. (A) A $T_1$-weighted MR image at TR=1 s, TE=5 ms. (B) A $T_2$-weighted MR image at TR=1 s, TE=115 ms. (C & D) The resulting FeMRI images showing detectable bands for [Fe]=9.7 and 48 μM, with a barely detectable band at [Fe]=1.97 μM.

FIG. 8A, FIG. 8B, FIG. 8C and FIG. 8D illustrate the FeMRI of LNCaP cells that have internalized anti-PSMA antibody-conjugated μMACs SPIONs. The cells were incubated with the SPIONs at 4° C., washed and then incubated for 60 min at 37° C. so that the cells could take up the SPIONs. $T_1$w (TR 0.5 s; TE 9 ms) and $T_2$w (TR 1.5 s; TE 23.5 ms) images (see insets of FIG. 8B, FIG. 8C and FIG. 8D) were taken at 1.0 T. The bands contained one and two million cells, respectively, with [Fe] of 359±34, and 658±41 μM.

DETAILED DESCRIPTION OF THE INVENTION

Figure 1A:
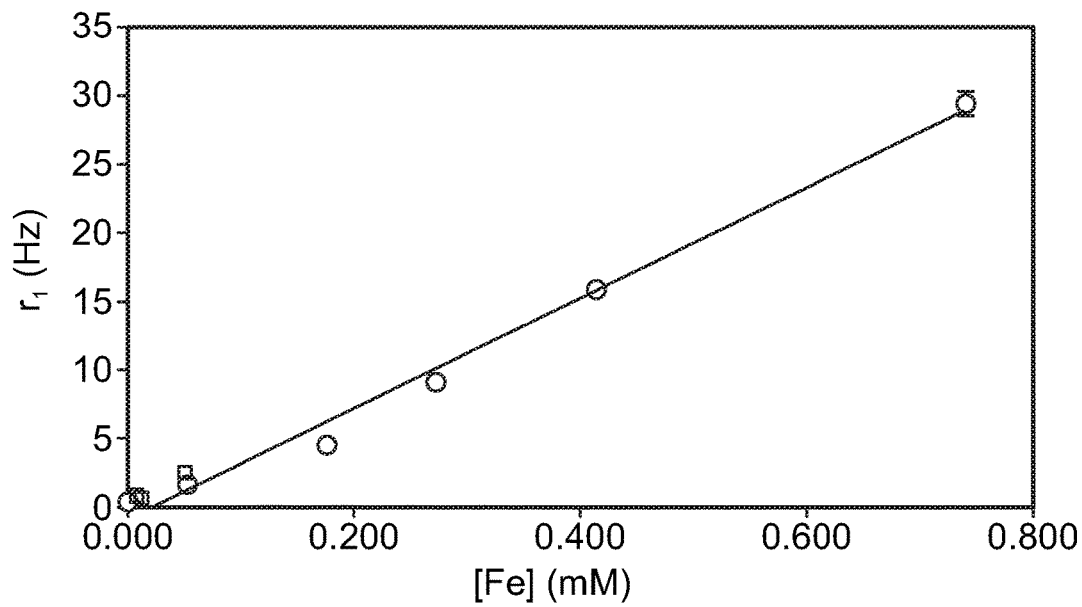
FIG. 1A and FIG. 1B illustrate the relationship between the measured iron concentration and the longitudinal ($r_1$) and transverse ($r_2$) water relaxation rate enhancements at 1.0 T in 1% agarose gels (filled symbols) containing mMACS beads, and (open symbols) anti-PSMA conjugated MACS beads bound to LNCaP cells in 1% agarose. The error bars reflect the standard errors from the fits to the relaxation time measurements. The slopes give relaxivities of $r_1$=38.3±1.1 Hz/mM, and $r_2$=800.4±15.9 Hz/mM.

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure or system. Further, the terms and phrases used herein are not intended to be limiting, but rather to provide an understandable description of the invention.

The present invention, in a preferred embodiment, provides a general, quantitative MRI method, hereinafter referred to as FeMRI, for the determination of the concentration of iron, or other contrast agents, through the conversion of a pair of $T_1$-weighted and $T_2$-weighted MR images into [Fe] images. The concept of image contrast was found to play a fundamental role in this interpretation of the MRI data. Therefore, the $T_1w$ and $T_2w$ images may be converted to contrast images, $C_1$ and $C_2$, by normalizing the images to the intensity of the tissue prior to any injections of SPIONs. With the guidance of FeMRI theory, a contrast difference image, $\Delta C = C_1 - C_2$, constructed from the difference in contrast between the $T_1w$ and $T_2w$ images, was a uniformly positive, monotonic function of the iron concentration. This relationship was found to be a function of the tissue's intrinsic relaxation properties, as well as the relaxation enhancements introduced by the presence of the conjugated SPIONs. This enables the inversion of this dependence so that the contrast difference image may be converted into an image of [Fe] within the tissue. FeMRI theory enables the ability to correctly interpret the qualitative contrast in $T_1w$ and $T_2w$ MR images of SPIONs and SPION-labeled cells in agarose.

The biological specificity of a SPION preparation is mainly determined by the recognition ligand attached to the nanoparticle's surface. Previous work suggests that Prostate Specific Membrane Antigen (PSMA) may serve as a good target epitope for prostate cancer cells. PSMA is a cell-surface protein that is vastly over-expressed on prostate tumors.

SPIONs may be constructed with an attached antibody against PSMA. Several human prostate tumor cell lines, including LNCaP, C4-2 and DU145, were cultured and the expression of PSMA was measured by flow cytometry. It was found that LNCaP and C4-2 cells expressed large numbers of PSMA molecules, while DU145 cells were virtually devoid of expression. FeMRI was applied to an analysis of the specific binding of anti-Prostate Specific Membrane Antigen (anti-PSMA) conjugated SPIONs to PSMA-positive LNCaP and PSMA-negative DU145 cells in vitro in agarose gels and found that FeMRI measurements discriminated among prostate tumor cell types based on their PSMA expression level. These results demonstrate the use of FeMRI for the specific monitoring of [Fe] in tumors.

In another embodiment, the present invention concerns an application of FeMRI for the non-invasive, quantitative molecular MRI of added magnetic nanoparticles, other magnetic contrast agents, or even other contrast agents, in biological tissues and other sites. FeMRI may be implemented on any MRI instrument, requiring only measurements of the background nuclear magnetic relaxation times ($T_1$, $T_2$) of the tissue of interest, injection of the magnetic particles, and the subsequent acquisition of a pair of $T_1$-weighted and $T_2$-weighted images. These images, converted into contrast images, are subtracted to yield a contrast difference image proportional to the absolute nanoparticle [Fe] image. FeMRI was validated with samples of SPIONs both in agarose gels and bound to human prostate tumor cells. FeMRI measurement of the binding of anti-prostate specific membrane antigen (PSMA) conjugated SPIONs to PSMA-positive LNCaP and PSMA-negative DU145 cells in vitro allowed a facile discrimination among prostate tumor cell types based on their PSMA expression level.

With respect to the quantitation of [Fe] by means of MRI, the concept of image contrast assumes fundamental significance. In MRI, contrast is defined as the signal intensity of a voxel, A, compared with the signal intensity of a reference voxel, B, so that if $S_A$ is the intensity of the voxel of interest and $S_B$ is the intensity of the reference voxel, then the contrast, C, is defined by $$C(S_A, S_B) = (S_A - S_B) S_B. \quad [1]$$

Note that if $S_A = S_B$ then the contrast is zero, and if $S_A = 0$, then the contrast is −1. Thus, the contrast of a voxel formally varies from −1 to +∞. MRI contrast agents alter $S_A$ while, presumably leaving $S_B$ unaffected.

Figure 1B:
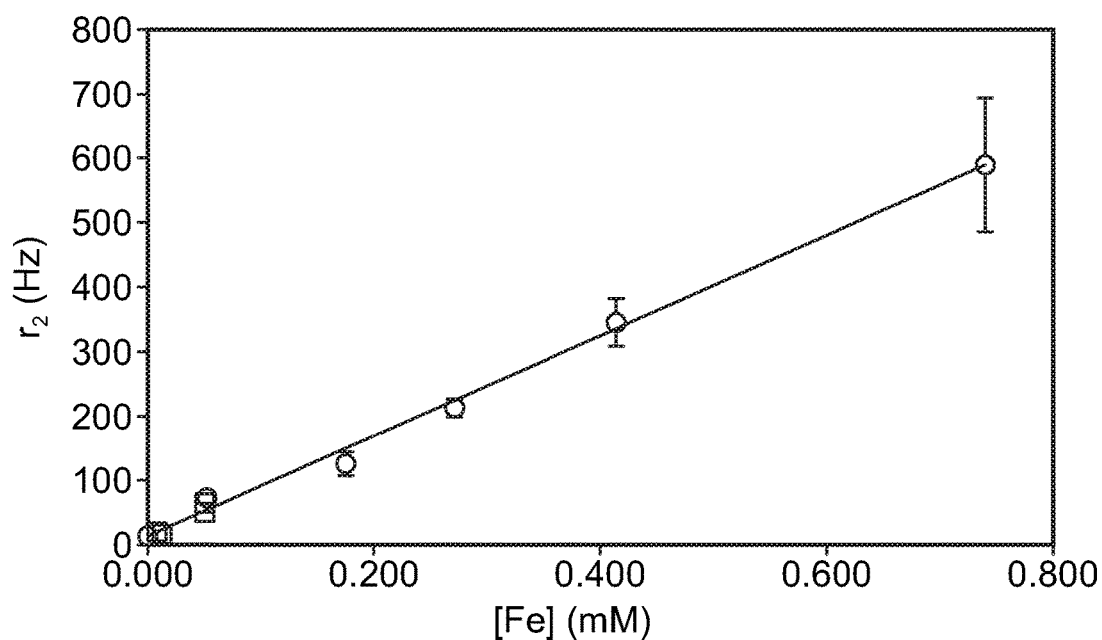

The intensity of the nuclear resonance signal from a voxel is a function of its intrinsic relaxation characteristics ($T_1$, $T_2$) modified both by the presence of extrinsic agents and by the acquisition parameters ($T_R$, $T_E$), where $T_1$ and $T_2$ are the longitudinal and transverse relaxation times, and $T_R$ and $T_E$ are the recycle and echo times, respectively. The influence of MRI contrast agents in tissues is on the $T_1$ and $T_2$ relaxation times of the abundant water NMR signal. Therefore, the efficacy of a contrast agent, which is known as its relaxivity, r, is determined by its perturbation of the relaxation times of tissue water. The water relaxation rate enhancement of a contrast agent is a linear function of its concentration and its relaxivity, and has different values for the water $T_1$ or $T_2$ because each of these tissue relaxation characteristics arises from different physical correlation times. The unperturbed water longitudinal and transverse relaxation rates, $R_1 (=1/T_1)$ and $R_2 (=1/T_2)$ are modified in the presence of a contrast agent by $$R_1 = 1/T_1 + r_1 c \quad [2]$$

$$R_2 = 1/T_2 + r_2 c \quad [3]$$

Where c is the concentration of the contrast agent and $r_1$ and $r_2$ are its longitudinal and transverse relaxivities, which are easily measured (See FIG. 1). In the absence of contrast agents, c=0, and the NMR signal, S, in a voxel is a function of the intrinsic relaxation times and the acquisition parameters:

$$S = M e^{-R_2 T_E} (1 - e^{-R_1 T_R}), \quad [4]$$

where M is an overall, machine-dependent amplitude factor. This may be referred to as the tissue background signal. Note that based on Eqn. [4] the NMR signal in a voxel can be obtained in two rather different ways: One in which $T_E \sim R_2$ and $T_R \gg R_1$, which is called $T_2$-weighted ($T_2w$) where contrast is primarily determined by differences in the tissue transverse relaxation times from voxel to voxel, and another in which $T_E \ll R_2$ and $T_R \sim R_1$, which is called $T_1$-weighted ($T_1w$) where voxel to voxel contrast is primarily determined by differences in their longitudinal relaxation times.

In the presence of a contrast agent, Eqn. [4] needs to be modified by inserting Eqns. [2] and [3] into the exponentials so that the voxel signal additionally depends on the concentration, c, of the contrast agent, $$S(c)=Me^{-(R_2+r_2c)T_E}(1-e^{-(R_1+r_1c)T_R}).\quad [5]$$

Since Eqn. [4] shows that the NMR signal is a function of both the recycle and the echo times used to acquire the data, and that the relaxivities of the contrast agent enter separately in the exponentials for the echo and recovery amplitudes, contrast agents with differences in $r_1$ and $r_2$ will have separate effects on the signal amplitude depending on the set of acquisition parameters. Note that SPIONs have $r_2 \gg r_1$, and hence are more potent at influencing tissue water $T_2$ than $T_1$ on a molar basis.

By using Eqn. [4] for the reference (or, from now on, we referred to as a tissue Background) voxel signal, and Eqn. [5] for the NMR signal from the voxel in the presence of the contrast agent, defines the contrast, C(c), in a voxel, with respect to the tissue background as $$C(c)=\frac{e^{-(R_2+r_2c)T_E}(1-e^{-(R_1+r_1c)T_R})-e^{-R_2T_E}(1-e^{-R_1T_R})}{e^{-R_2T_E}(1-e^{-R_1T_R})},\quad [6]$$

and in Eqn. [6] the tissue contrast depends, in a complex manner, on the concentration of the contrast agent. The common amplitude factor M was neglected because it is the same for the numerator and denominator and cancels out. While Eqn. [6] appears too complex to be useful, it provides a method for quantitation of the concentration of the contrast agent. A separate version of Eqn. [6] may be written for each of the two important types of nuclear resonance images; one for the $T_1$w case and another for $T_2$w. Furthermore, to simplify the analysis, the tissue background signal, while computed in the theory, is simply measured from the voxels of interest in an MR image in the absence of contrast agent, and is therefore just a number. Then, there are two equations for voxel contrast, one for the $T_1$w case and another for the $T_2$w case. Let's denote them by subscripts 1 and 2, respectively.

$$C_1(c)=\frac{e^{-(R_2+r_2c)T_{E1}}\left(1-e^{-(R_1+r_1c)T_{R1}}\right)-e^{-R_2T_{E1}}\left(1-e^{-R_1T_{R1}}\right)}{e^{-R_2T_{E1}}\left(1-e^{-R_1T_{R1}}\right)},\quad [7]$$

$$C_2(c)=\frac{e^{-(R_2+r_2c)T_{E2}}\left(1-e^{-(R_1+r_1c)T_{R2}}\right)-e^{-R_2T_{E2}}\left(1-e^{-R_1T_{R2}}\right)}{e^{-R_2T_{E2}}\left(1-e^{-R_1T_{R2}}\right)}.\quad [8]$$

Figure 2A:
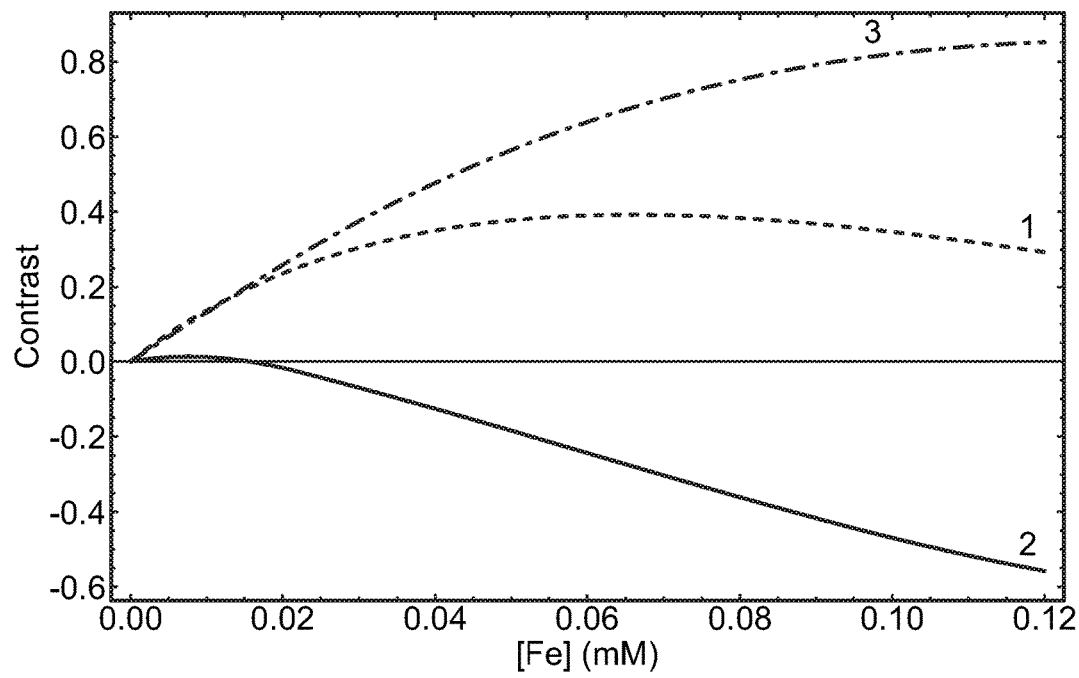
FIG. 2A illustrates a theoretical dependence of the tissue contrast on measured and set tumor MRI Parameters as a function of the iron concentration. Measured Parameters at 1.0 T: The $r_1$ relaxivity of the SPIONs was: 38.3 Hz/mM. The $r_2$ relaxivity of the SPIONs was: 800.4 Hz/mM. The tumor native $T_1$ was: 0.72 seconds. The tumor native $T_2$ was: 0.108 seconds. Set Parameters: The echo time for the $T_1$-weighted image was: $TE_1$=0.004 seconds. The echo time for the $T_2$-weighted image was: $TE_2$=0.0235 seconds. The recycle time for the $T_1$-weighted image was: $TR_1$=0.5 seconds. The recycle time for the $T_2$-weighted image was: $TR_2$=1.0 seconds. Curve 1 is for a $T_1$-weighted image, curve 2 is for a $T_2$-weighted image, and curve 3 is the contrast difference.

These can then be rewritten in an obvious notation as $$C_1(c)=\frac{(S_1(c)-B_1)}{B_1},\quad [9]$$

$$C_2(c)=\frac{(S_2(c)-B_2)}{B_2},\quad [10]$$

where $S_1$ ($S_2$) is the (measured) $T_1$w ($T_2$w) voxel signal amplitude in the presence of the contrast agent, and $B_1$ ($B_2$) is the measured $T_1$w ($T_2$w) amplitude in the absence of the contrast agent. Eqns. 9 & 10 were modeled in Mathematica© as a function of the concentration several popular SPIONs (Miltenyi µMACs, and Dynal Dynabeads) with the subsequent prediction that the contrast in $T_1$w images would differ by sign from that in $T_2$w images depending on the SPION [Fe] and the image acquisition parameters. While the contrast in $T_2$w images was usually negative, that for $T_1$w images could be of either sign. What was most important, however, was the discovery that the difference in contrast, $$\Delta C(c)=C_1(c)-C_2(c)\quad [11]$$

was always positive, and, for physiologically-relevant, FDA-limited, [Fe], a monotonic, single-valued function of [Fe]. However, Eqn. 11 is of limited value for obtaining [Fe] from the measured ΔC. However, using Mathematica© to compute the empirical relationship between the contrast difference as a function of the iron concentration, ΔC=f ([Fe]), and then fitting this to high-accuracy with a polynomial which enables it to invert to give $$[Fe]=g(\Delta C)\quad [12]$$

and to determine the unknown function, g. a typical set of MRI was found that gave parameters (See caption for FIG. 2) [Fe]=0.0005051+0.03961 ΔC+0.009258 (ΔC)²+0.008857 (ΔC)³. ΔC is measured from a pair of images and Eqn. 12 is used to convert the difference image into one directly giving the [Fe] in each voxel, in units of millimoles/liter. Since the background is subtracted during the calculation of the contrast images, $C_1$ and $C_2$, the resultant [Fe] map is always bright against a zero background. A background with a zero image intensity promotes the ease of use in examining a desired region of interest.

Since the [Fe] MR image is derived from images obtained in the same gradient coordinates as the $T_1$w and $T_2$w images, registration of the FeMRI data with the anatomical data is absolute.

One application of FeMRI is to the study of the temporal and spatial disposition of SPIONs in tumors. This is summarized stepwise below. For the method described herein of SPION binding to cells, step three used the SPION-free agarose signal as the background and the procedure only required steps 1-3, 6-8.

(1.) Measure the relaxivity of the SPIONs, both $r_1$, and $r_2$.
(2.) The $T_1$ and $T_2$ relaxation times of the tissues of interest are measured.
(3.) A pair of control images with $T_1$ and $T_2$ weighting are taken to give the tumor signal backgrounds, $B_1$ and $B_2$, in the region of interest.
(4.) The SPIONs are administered.
(5.) Another pair of MR images are taken with $T_1$ and $T_2$ weighting, to give $S_1$ and $S_2$.
(6.) Each of these images are converted into contrast maps using the measured $T_1$w, or $T_2$w, backgrounds, producing $C_1$ and $C_2$ images.
(7.) The difference between these two contrast maps is an image of ΔC whose intensity is proportional to the Fe concentration, [Fe].
(8.) The intensity of this difference image is converted, using the relationship between [Fe] and contrast (Eqn. 12) to an image whose voxel intensity directly gives the [Fe] within the voxel.

A typical iron concentration that is needed for detection assumes that a LNCaP prostate tumor cell is a sphere approximately 18 µm in diameter. Assuming that SPIONs can completely cover the surface, then ~325 1.05 µm Dynabeads, and 9×10⁵ MACs SPIONs can bind to each cell at saturation. With an iron content of 1.23×10⁻¹³ g per Dynabead and 1.67×10⁻¹⁷ g Fe/bead per µMACs SPION, a sample of $2=10^6$ LNCaP cells per mL saturated with µMACs SPIONs would result in an iron concentration of approximately 53 µM, and for Dynabeads a value of 105 µM. These order of magnitude estimates are well within the range for FeMRI detection and are congruent with the FeMRI measurements of the present invention. A cell concentration of 2 million cells/ml is only 3% of the cell density of a tumor which contains ~$3 \times 10^5$ LNCaP cells/mm$^3$. For an unoptimized FeMRI acquisition scheme of an embodiment of the present invention, the limit of detection is [Fe]~2 µM.

Since the magnetic relaxation of water protons in general is a function of the rotational correlation time of the water molecule, the water relaxation rate enhancement (relaxivity) of a SPION depends on the Larmor frequency of the NMR instrument used to measure it. For example, for µMACs SPIONs, it was found that $r_1$ dropped linearly from 175 Hz/mM at 0.27 T, to 1.67 Hz/mM at 4.7 T. Therefore, it was necessary to measure the relaxivity of a SPION at the same field strength at which it was to be used. For example, it was determined the $r_1$ and $r_2$ relaxivities of both µMACs and Dynabeads at 1.0 T to be $r_1$=38.3±1.1 Hz/mM, and $r_2$=800.4±15.9 Hz/mM (mean±S.D.) for the µMACs (FIG. 1) and $r_1$=0.080±0.0023 Hz/mM and $r_2$=32.02±0.91 Hz/mM for the dynabeads. These measurements were also performed at 0.27 T, 1.9 T and 4.7 T.

Figure 2B:
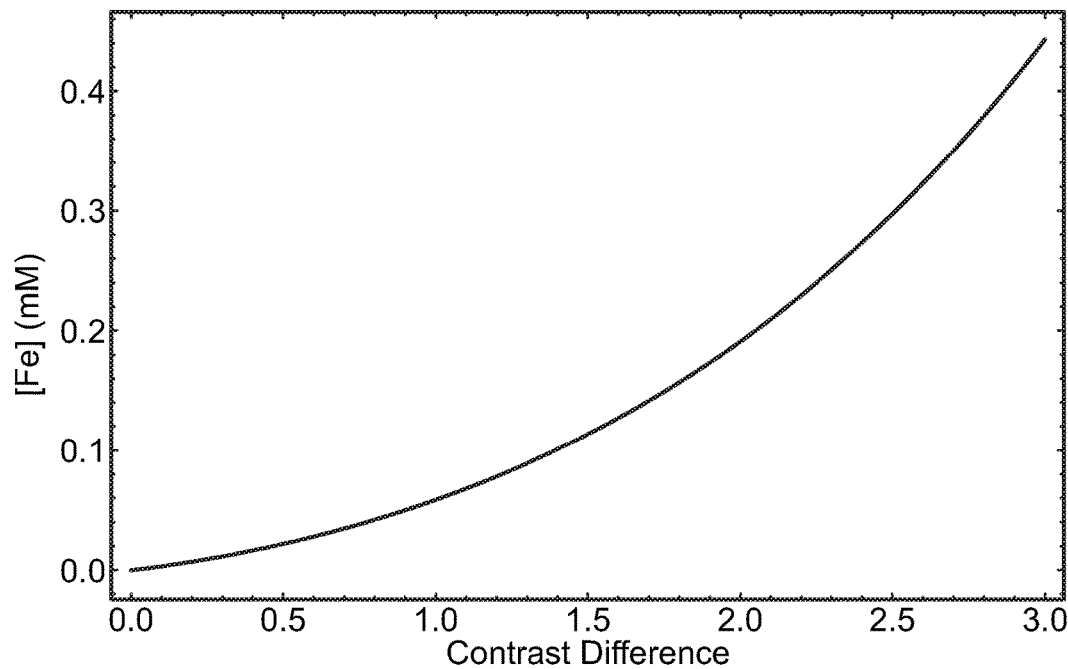
FIG. 2B shows an inversion of the contrast difference relationship from FIG. 2A to give the empirical function (Eqn. 12) needed to convert contrast difference images into [Fe] images: [Fe]=0.0005051+0.03961 $\Delta C$+0.009258 $(\Delta C)^2$+0.008857 $(\Delta C)^3$, for the acquisition parameters in FIG. 2A. Even though this function is nonlinear, it is monotonic and well-defined.

The MRI data generated using the embodiments of the present invention were taken with recycle times ranging from 500 to 5000 ms, and with echo times from 4 to 145 ms. A typical theoretical calculation of the $T_1$w and $T_2$w image contrast, and contrast difference, using the measured relaxivities of the µMACs SPIONs at 1.0 T and acquisition parameters within this range shows (FIG. 2A) that the $T_2$w image contrast is predominantly negative for all but the lowest [Fe] values, while the $T_1$w image contrast is positive over the range of [Fe] anticipated in biological tissues. The contrast difference is always positive, and is also seen to be a monotonic, increasing function of [Fe], for all iron concentration values expected. The inversion of the contrast difference function (Eqn. 12) to produce the relationship between [Fe] and ΔC (Eqn. 12) is shown in FIG. 2B with the functional dependence given by [Fe]=0.0005051+0.03961 ΔC+0.009258 (ΔC)$^2$+0.008857 (ΔC)$^3$. While this inversion is straightforward to perform in Mathematica®, it needs to be computed for each set of tissue, SPION and acquisition parameters. It also serves as an essential guide to achieve the optimal sensitivity of contrast to [Fe]. The units of [Fe] naturally arise as mM due to the fact that the longitudinal and transverse relaxivities of the SPIONs are given in Hz/mM; these units set a natural scale to the problem.

Figure 3:
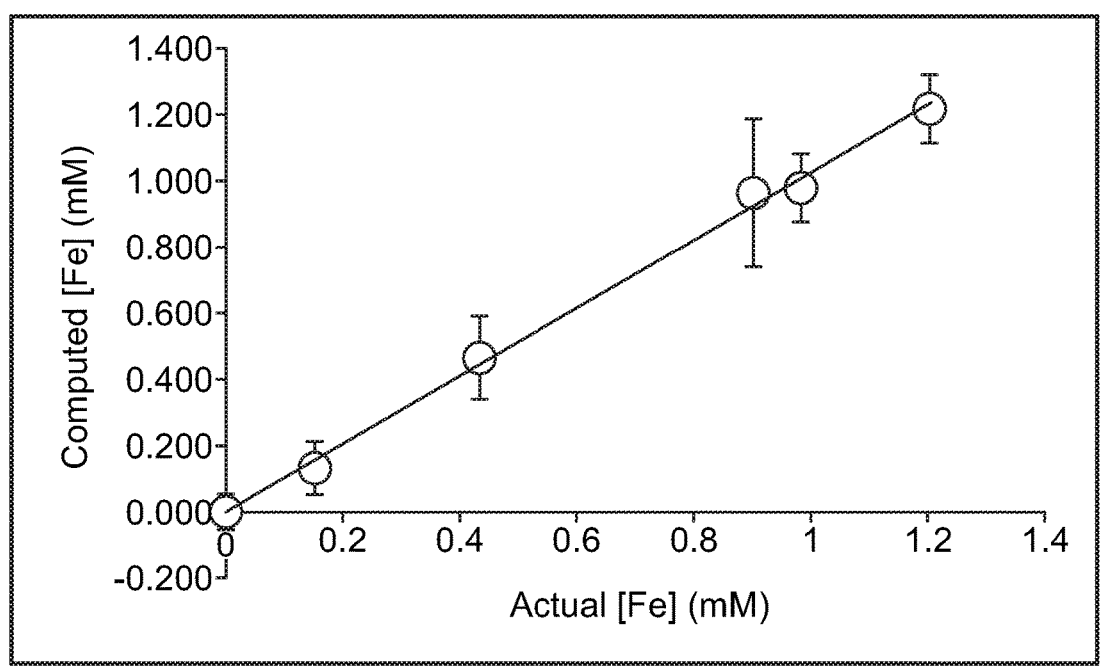
FIG. 3 is a validation of the theoretical dependence of contrast on [Fe]. Suspensions (n=3) of varying concentrations of μMACs SPIONs were prepared in 1% agarose gels and imaged with TR=0.5, 5 s, TE=7 and 20 ms at 4.7 T. The relaxivity of the SPIONs was $r_1$=1.668 Hz/mM, and $r_2$=21.35 Hz/mM. The least squares line fitted to the data has a slope of 1.024 and an intercept of +0.5 μM. The background $T_1$ and $T_2$ of the agarose were 1.55 sec and 0.108 sec, respectively.

To compare the results of using the embodiments of the present invention with independent measurements of the [Fe] in MRI samples of 1% agarose gels were prepared containing a number of known concentrations of SPIONs. After the MRI measurements, the gels were removed from the tubes and the [Fe] was measured using the Prussian blue iron assay. Even though the relationship between pixel contrast difference and [Fe] was clearly non-linear (FIG. 2B) it was still monotonic and single-valued and could therefore be used to convert ΔC into [Fe]. Thus the data show (FIG. 3) that [Fe] can accurately be measure. The slope of the fitted line is 1.024±0.041, which is not statistically, significantly different from 1.0, with an intercept of only 0.0005 mM Fe.

A dynabead stock solution was diluted 1:6250, 1:1250, and 1:250 into 1% agarose and placed into 10 mm plastic tubes as bands surrounded by agarose. A $T_1$-weighted MR image was taken (FIG. 4A) at TR=1 s, TE=5 ms, nex=6, and a $T_2$-weighted image (FIG. 4B) was taken at TR=1 s, TE=115 ms. The resulting FeMRI image (FIG. 4C) showed detectable bands for [Fe]=9.7 and 48 µM, with a barely detectable band at [Fe]=1.97 µM. These bands were more easily seen and quantitated by means of a Mathematica-generated 3-dimensional surface plot (FIG. 4D) of the [Fe] as a function of the spatial coordinates in the tube. The two bands with the highest [Fe] were easily detected, with signal to noise ratios of 4.7 (9.7 µM Fe) and 6.6 (48 µM Fe), but the band with only 1.97 µM Fe had a signal to noise ratio of only 1.6, which was less than 2σ different from the noise, and therefore not a candidate detection. This shows a detection limit of ~2-2.5 µM Fe, for a signal to noise ratio of ~45:1 for the input $T_1$-weighted and $T_2$-weighted images.

To use MRI of SPIONs for tumor detection, a cell-surface epitope that discriminates between cancer cells and normal, non-malignant cells should be identified. A large body of research on prostate cancer specific cell markers has led to the identification of prostate specific membrane antigen (PSMA), the folate receptor, as a cell-surface protein that is highly-overexpressed on prostate tumors.

PSMA is a cell surface protein expressed in the prostate at levels a thousand-fold greater than that found in other tissues, such as the kidney. PSMA expression increases in prostate cancer and its expression is correlated with tumor grade, pathological stage, aneuploidy and biochemical recurrence. This makes PSMA a good candidate for monitoring the progression of prostate cancer. A humanized version of PSMA, J591, is already being investigated in clinical trials and is successfully able to image sites of metastasis. It has also been demonstrated for use in LNCaP tumor localization in nude mice with labeled $^{131}$I and $^{111}$In J591 and J415 MAb. In addition, phase 1 studies using radiolabeled or cytotoxin (DM1) linked J591 have also shown excellent tumor targeting.

After the PSMA expression at the level of mRNA was measured, it was confirmed by the cell-surface expression using flow cytometry of several commonly-cultured human prostate tumor cells lines, including LNCaP, C4-2, DU145 and PC3 cells. RT-PCR revealed significant expression of PSMA in both the LNCaP and C4-2 cell lines, while it was virtually undetectable in DU-145 and PC-3 cells under the PCR conditions used. These results are in agreement with previously published studies. Flow cytometry showed that LNCaP and C4-2 cells expressed (1.05±0.10)×10$^6$ and (1.67±0.10)×10$^6$ PSMA molecules per cell, while DU145 and PC3 cells expressed 100-fold less at only (1.35±0.52)× 10$^4$ PSMA molecules per cell. These results are in agreement with similar reports in the literature on these particular cell lines. Given these very different PSMA expression levels, LNCaP and C4-2 cells were used as PSMA positive samples, and DU145 cells as negative controls.

Figure 5A:
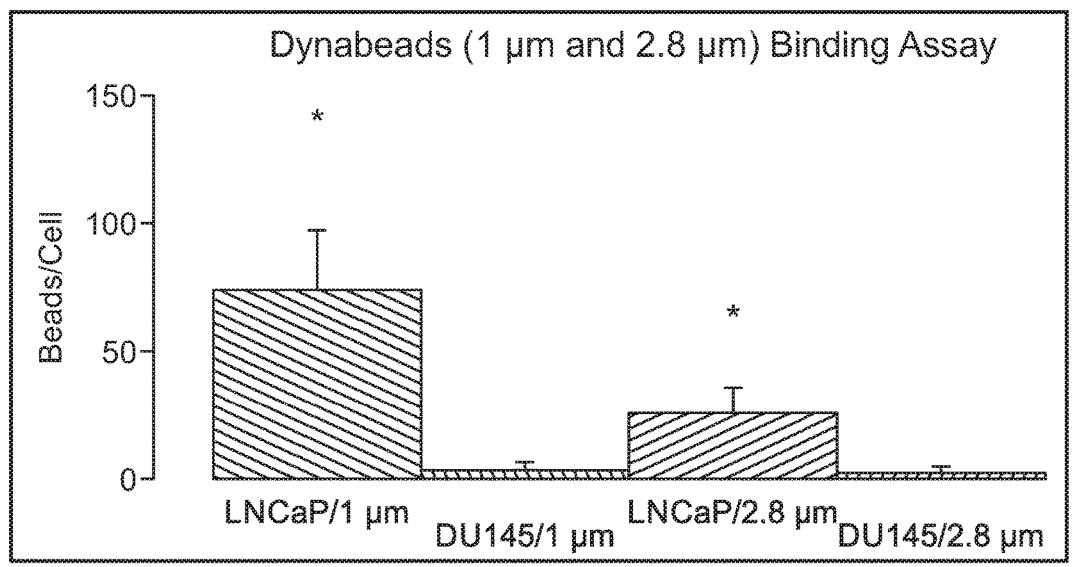
FIG. 5A and FIG. 5B illustrate the specific binding of anti-PSMA antibody-conjugated SPIONs to Prostate Cancer cells, in vitro. Fully humanized monoclonal antibody (J591) against PSMA was conjugated to dynabeads (2.8 μm, 1.0 μm) and to pMACS (~50 nm) and then incubated with either PSMA-positive LNCaP or PSMA-negative DU145 cells at 4° C. (to prevent uptake into the cytoplasm), washed and examined under the microscope. The SPIONs bound to each cell were either counted directly for n=100 cells, or in the case of the μMACs, Perl's stain for iron was applied to reveal the presence or absence of iron. Note that only the PSMA-positive LNCaP cells bound the SPIONs or stained blue (indicating the presence of μMACs SPIONs.
Figure 5B:
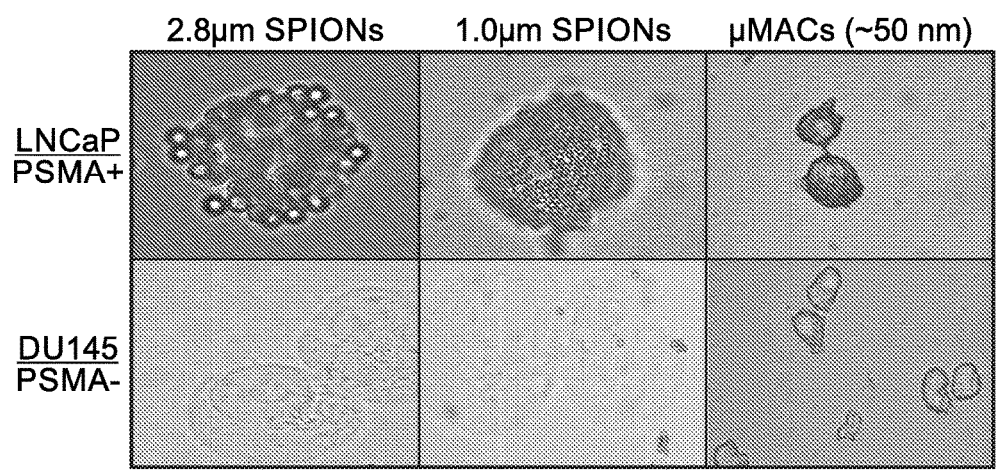

Anti-PSMA antibody, 3C6 was used as a recognition ligand for conjugation to the surface of the various SPIONs. Binding assays (FIG. 5) in vitro showed that, on average, LNCaP cells (n=100) bound 80±16 of the 1 µm anti-PSMA conjugated dynabeads per cell. The control, PSMA-negative DU145 cells did not bind significant amounts of any of the anti-PSMA conjugated SPIONs.

Figure 6:
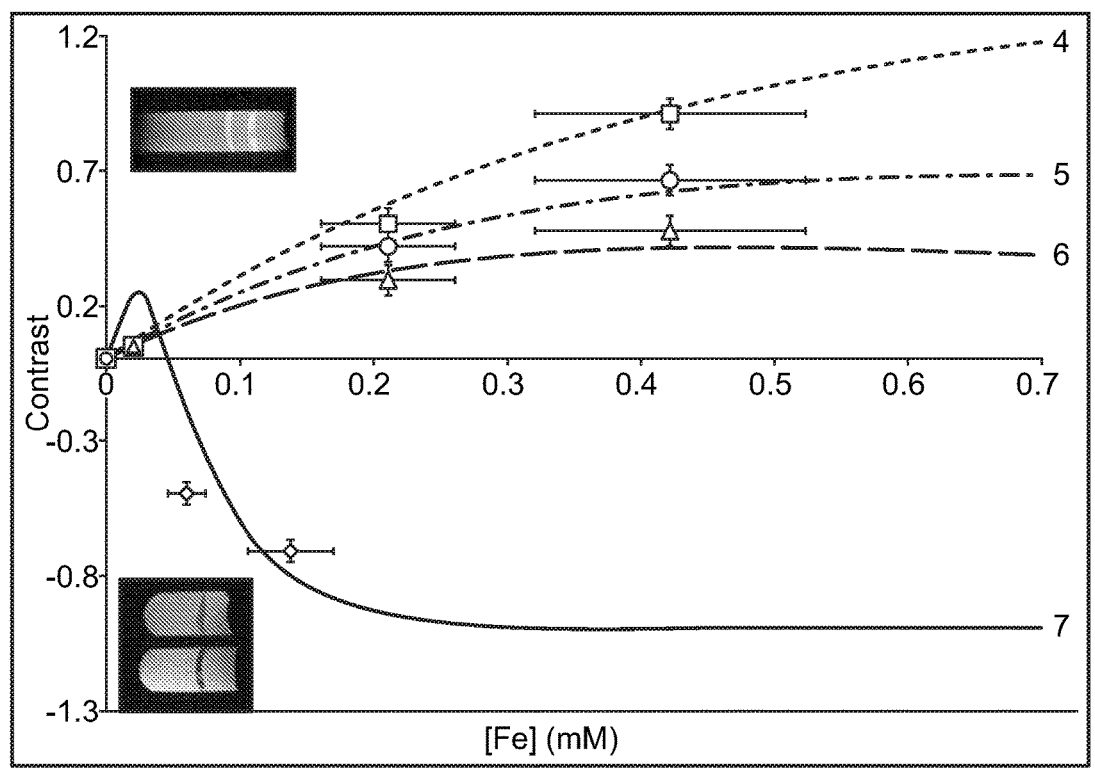
FIG. 6 provides the MRI Contrast as a function of [Fe] for $T_1$-weighted (Line 4, Line 5, Line 6) and $T_2$-weighted (Line 7) MR images of suspensions of LNCaP cells with anti-PSMA-conjugated dynabeads (top image and curves) and anti-PSMA-conjugated μMACs SPIONs (bottom image and curve). Note that the $T_1$ w contrast was positive, while the $T_2$-w contrast was negative, in agreement with Eqns. [7,8]. The smooth lines are the theoretical predictions for the contrast given the measured relaxation and set acquisition parameters for each image: Line 4, (TR=0.5 s, TE=0.009 s); Line 5, (TR=1.0 s, TE=0.009 s); Line 6, (TR=1.5 s, TE=0.009 s); Line 7, (TR=1.0 s, TE=0.023 s). The insets show representative images from each set used to derive the contrast data. The LNCaP cells bound (15.3±3.7)×10$^4$ μMACs SPIONs per cell and the cell densities ranged from zero to 1.27×10$^5$ per μl. These cells also bound ~80 dynabeads per cell. The measured agarose relaxation times at 1.0 T gave $T_1$=2.0 s, $T_2$=0.108 s.

The theoretical relationship between MRI contrast and [Fe] (FIG. 2A) predicted that for small [Fe] the $T_1$w image contrast would be positive, while the $T_2$w contrast would be negative for cells that bound SPIONs. While a test of this relationship (FIG. 4) showed that these predictions were qualitatively correct, it was of further interest to numerically compare these predicted relationships with measurements. It was determined (FIG. 6) that FeMRI could quantitatively reproduce the dependence of contrast in $T_1$w and $T_2$w MR images on [Fe] over essentially the entire physiological range of SPION iron concentrations.

Figure 7A:
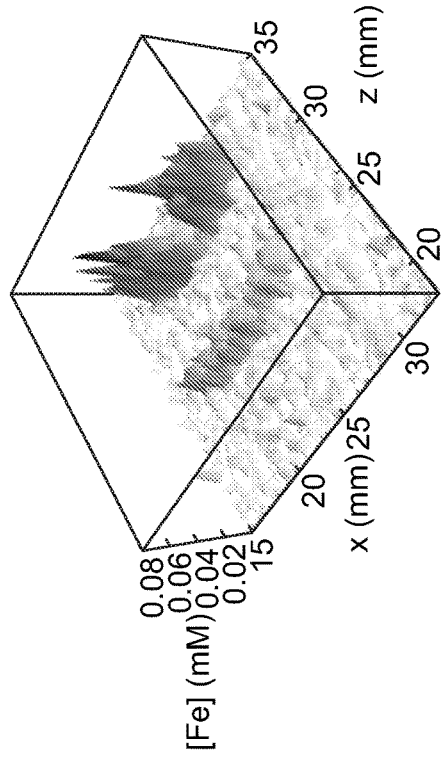
FIG. 7A, FIG. 7B, FIG. 7C and FIG. 7D illustrate the FeMRI of anti-PSMA antibody-conjugated SPIONs to LNCaP Prostate Cancer cells, in vitro. Fully humanized anti-PSMA antibody J591 was conjugated to μMACs SPIONs which were then bound to LNCaP cells and aliquots of cells containing 2×10$^6$, 1×10$^6$, and 1×10$^5$ cells were layered in 1% agarose gels. The bands containing 2 and 1 million cells were easily detectable, but the band containing only 100,000 cells barely reached the limit of detection. The [Fe] in each band is plotted against the number of cells to yield the contribution per cell. From the band volume, it was calculated that there were ~3200 μMACs SPIONs per cell.
Figure 7B:
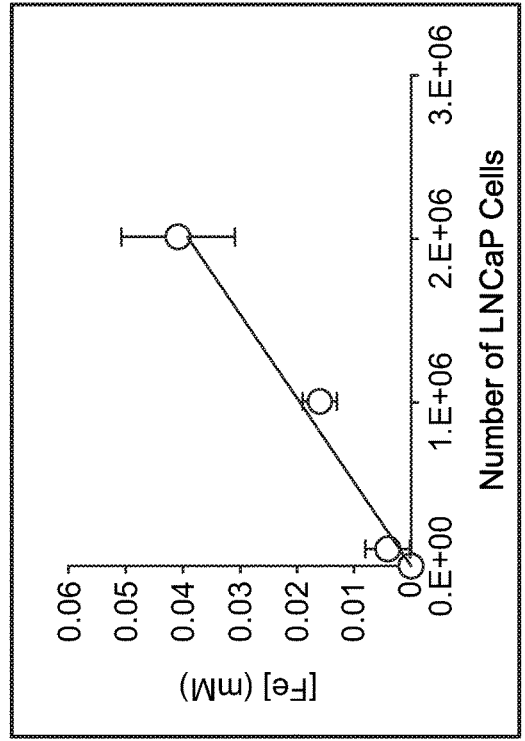
Figure 7C:
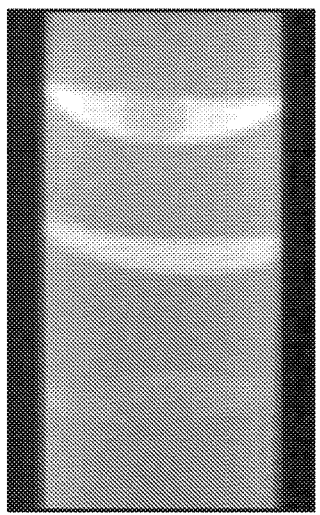
Figure 7D:
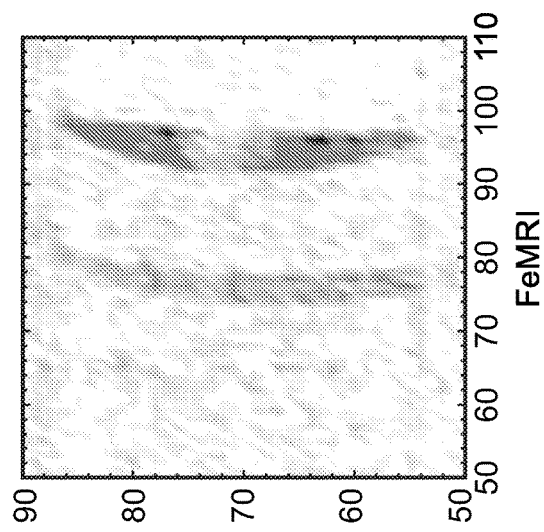
Figure 9A:
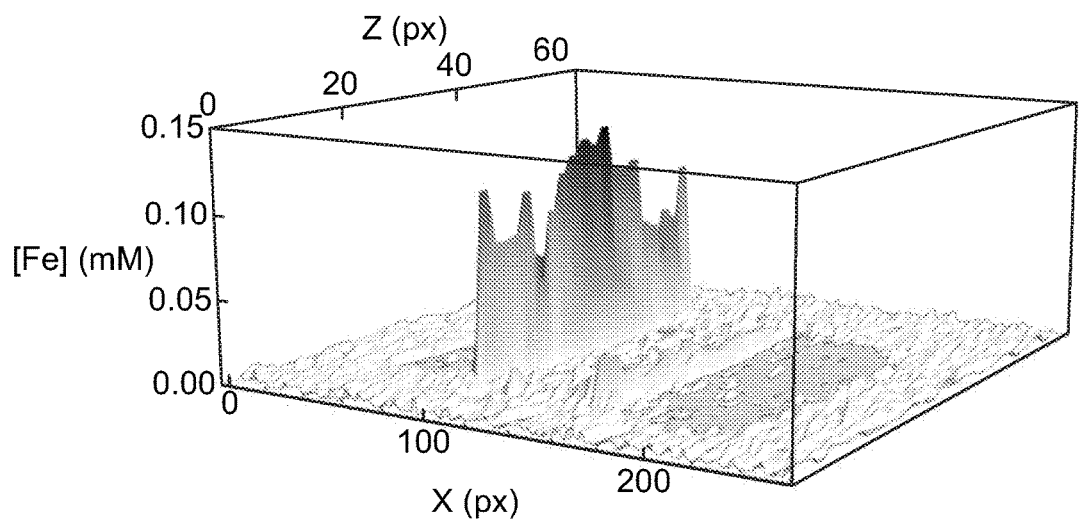
FIG. 9A, FIG. 9B, FIG. 9C and FIG. 9D illustrate the FeMRI with anti-PSMA antibody-conjugated μMACs SPIONs can discriminate PSMA-positive LNCaP from PSMA-negative DU145 cells. The cells were incubated with the SPIONs for 30 min, washed and then mixed with 1% agarose and layered into a tube containing 1% agarose. The DU145 cells were inserted first and appear as a weak band near the bottom of the tube, while the LNCaP cells were inserted second and appear as a strong band near the top of the tube. The [Fe]=(78±29) μM for the LNCaP cells and only (9±4) µM for the DU145 cells indicating a >8.7-fold difference in iron binding by the two cell lines.
Figure 9B:
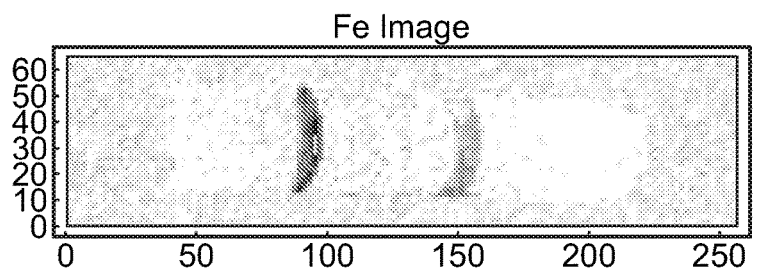
Figure 9C:
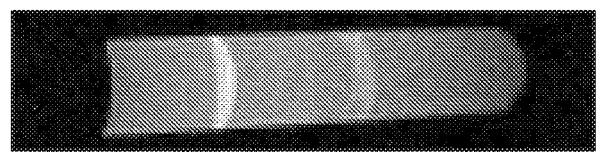
Figure 9D:
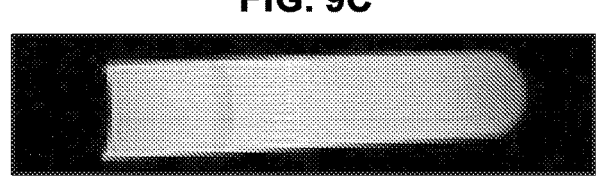

For FeMRI determination of [Fe] for anti-PSMA conjugated μMACs SPIONs bound to PSMA-Positive prostate tumor cells, samples of PSMA-positive human prostate tumor LNCaP cells were incubated with biotinylated anti-PSMA, washed to remove free antibody, incubated with streptavidin-conjugated μMACs SPIONs, washed to remove unbound SPIONs and mixed with 0.1 ml of 1% agarose. Aliquots containing $2 \times 10^6$, $1 \times 10^6$, and $1 \times 10^5$ cells were then layered onto an existing 1% agarose gel, and then covered with additional agarose to form a tube containing bands of cells in agarose, and intervening bands of cell-free gel. FeMRI was performed on these cell phantoms in order to show that this method of an embodiment of the present invention was capable of imaging the iron on SPION-bound cells, to measure the [Fe] and to determine the limits of detection for SPION-bound cells. The results show (FIG. 7) that LNCaP cells with anti-PSMA bound to their surface bound μMACs SPIONs and gave rise to significant, positive $T_1w$ MRI contrast. Computation of the FeMRI image (FIG. 7B and FIG. 7C) revealed the specific presence of iron only in the cell-containing bands. The bands containing 2 and 1 million cells were easily detectable, but the band containing only 100,000 cells did not reach the limit of detection. The measured [Fe] ranged from 4 to 41 μM, which combined with the band volume of 67 μl and the number of cells per band yielded an iron value ~$9 \times 10^{-14}$ g Fe per cell, resulting from ~3200 μMACs per cell. This is about 3.5% of saturation, where 90,000 SPIONs could potentially tile the surface of a LNCaP cell. It was also found that the FeMRI signal scaled linearly with the number of cells present (FIG. 7D). Again, this shows that for an embodiment of the present invention, the limit of detection was ~2 μM Fe.

μMACs bind to anti-PSMA conjugated LNCaP Cells at 4° C., but are not taken up into the cytoplasm until the cells are warmed to 37° C., at which temperature the SPIONs are rapidly internalized with a time constant of 5-7 minutes. Therefore, to bind SPIONs to the cell surface at 4° C. and then to allow internalization by raising the temperature, a cell phantom in agarose was prepared and used FeMRI to measure the [Fe]. The results (FIG. 8) showed that a strong FeMRI signal could still be observed from the internalized SPIONs, and that this signal scaled linearly with the number of cells, as shown above (FIG. 7). It was found that these cells took up $(26.2 \pm 1.2) \times 10^4$ SPIONs per cell, in agreement with the previous order of magnitude estimate which corresponded to $(1.74 \pm 0.12)$ pg Fe/cell. The MR images (FIG. 8) provided a strong visual confirmation of the theoretical prediction (FIG. 2A) that for the acquisition parameters used here, $T_1w$ images should show positive contrast and $T_2w$ images should show negative contrast.

In order to use anti-PSMA conjugated SPIONs for the specific detection of prostate tumors, it should be shown that these SPIONs can distinguish cells based on their expression of PSMA. Prior RT-PCR and flow cytometry measurements show that LNCaP cells were PSMA-Positive, while DU145 cells expressed 100-fold less PSMA and are therefore essentially PSMA-negative. In other aspects, the present invention incubated biotinylated-anti-PSMA with LNCaP and DU145 cells, washed the cells to remove unbound 3C6, and then incubated equal numbers of each of these cells with streptavidin-conjugated SPIONs, washed away the unbound particles, and prepared agarose gels in plastic tubes. When FeMRI was applied to these samples, it was found (FIG. 9) that the LNCaP cells bound 8.7-fold more of these SPIONs than the DU145 cells, indicating excellent specificity for the detection of cell-surface PSMA.

In other aspects, the present invention provides a general, quantitative MRI theory for the measurement of nanoscale magnetic objects introduced into biological systems. This new ability to directly, and simply, measure the amount of a nanoparticle, or other magnetic material using standard MRI, will enhance a large class of nanotechnology studies. The present limit of detection for FeMRI was found to be ~2 μM, but that could evidently be lowered through judicious choices of the relaxivity of the objects, which in this case were SPIONs, and by calculating and optimizing the contrast and signal to noise ratio based on varying the MRI acquisition parameters. It was also found that expected concentrations of iron could be detected from SPIONs and from SPIONs bound to and internalized by cells. This allowed the embodiments of the present invention to show that FeMRI could discriminate among prostate tumor cell types based on the expression, or lack thereof, of cell surface tumor markers; in this particular case PSMA.

Moreover, previous attempts at iron-specific imaging have relied on the alteration in $T_2$ or $T_2^*$ by iron. These methods do not produce images, as the present invention, where the intensity is solely, and unambiguously, dependent on [Fe]. They rely on the assumption that the [Fe] is the sole determinant of either $T_2$ or $T_2^*$, and ignore the many other contributions to transverse relaxation. Other methods, such as quantitative susceptibility mapping, suffer from the large background variations in the phase of the MR image due to susceptibility variations independent of [Fe] or from susceptibility jumps at the air-tissue boundaries of the body. Also, the expertise and software to accomplish quantitative susceptibility mapping are not widely available.

In other embodiments, the present invention provides a method that is easy to apply, using only $T_1w$ and $T_2w$ images available on any MRI system. This ease of application permits the embodiments of the present invention to be applied to a large class of biological, and physical-chemical problems. Note that FeMRI is primarily a method for the quantitative imaging of added [Fe] arising, for example, from the injection of magnetic agents, and is not a method for the determination of total tissue iron, because the background MRI signals are removed from the analysis to produce the basic contrast images.

Given the ability to produce quantitative maps of the distribution of nano-scale magnetic objects (superparamagnetic nanoparticles, soluble paramagnetic agents like gadolinium, manganese, cobalt, etc.) the embodiments of the present may be used to measure, monitor and follow the time course of injected magnetic materials in the body. For example, the embodiments of the present may use FeMRI to image the [Fe] as a function of time for SPIONs injected into prostate tumor xenografts in mice, and to follow the time course of anti-PSMA-conjugated SPIONs as they infiltrate and bind to prostate tumor xenografts after intravenous injection.

In yet other embodiments of the present invention, by knowing the relationship between the amount of drug, and the amount of iron, in the nanoparticles, it becomes feasible to use the FeMRI signal as a surrogate for the [drug] in the tissue of interest to measure drug dosage to the tumor, non-invasively. One area in which this information would be of critical importance is for the chemotherapy of brain tumors where it is not accurately known if the drug actually reaches the tumor in therapeutic concentrations. Such information is currently only available with PET imaging of expensive, short-lived, radioactively-labeled molecules. The FeMRI methods of the present invention may be used for non-destructive testing.

In a preferred embodiment, the present invention provides a method of conducting non-destructive testing of an object comprising the steps of: obtaining a first pair of $T_1$-weighted and $T_2$-weighted images of the object in order to determine the background MRI signal intensity and measurements of the background nuclear magnetic relaxation times ($T_1$, $T_2$) of the object without magnetic material; administering magnetic material to the object; obtaining a second pair of $T_1$-weighted and $T_2$-weighted MR images of the object with magnetic materials added; and converting the second pairs of images into a pair of contrast images which are subtracted from each other to yield a contrast difference image proportional to the absolute concentration of the magnetic material. This technology will open this field to a large variety of additional studies that were previously thought to be too expensive, or impractical.

Another of the many potential applications of FeMRI would be to measure the infiltration of tissues by macrophages. For example, diabetic osteomyelitis is accompanied by a massive influx of these cells as the body attempts to clear the infection. Macrophages take up iron-containing nanoparticles, such as ferumoxytol, and serve as carriers of MRI contrast into the tissue. By means of FeMRI, the present invention could potentially infer the macrophage density, and hence the severity of infection, through FeMRI measurements of the [Fe] in the affected tissues.

Fluorescein-conjugated streptavidin was obtained from Molecular Probes (Eugene, Oreg.). Dynabeads® MyOne™ Streptavidin was obtained from Dynal Biotech (Oslo, Norway), and MACS® Streptavidin Microbeads (μMACs) were obtained from Miltenyi Biotec (Bergisch Gladbach, Germany). Anti-PSMA antibody (clone 3C6) was purchased from Northwest Biotherapeutics (Bothell, Wash.). Antibody was biotinylated using EZ-Link™ Sulfo-NHS-LC-Biotin from Pierce (Rockford, Ill). Fully-humanized anti-PSMA antibody J591 was purchased from N. Bander (Weil Cornell Medical College, N.Y.). The prostate cancer cell lines LNCaP, PC-3, and DU-145 were purchased from the American Tissue Type Collection (Manassas, Va.). The C4-2 prostate cancer cell line was a kind gift from Dr. G. N. Thalmann (University of Bern, Switzerland).

SPIONs, gels containing SPIONs, and SPION-labeled cell suspensions were dissolved in 0.5 ml of 6 N HCI (Sigma-Aldrich, St. Louis, Mo.) at 95° C. overnight in sealed tubes. Aliquots (0.1 ml) of the resulting solution were assayed for iron using the Prussian Blue reaction by adding them to 0.9 ml of 10% $K_4Fe(CN)_6$ (Sigma-Aldrich, St. Louis, Mo.), incubating at 60° C. for 30 min, and reading the absorbance at 690 nm. Standard curves (n=7) which were prepared using 1.00 mM $FeCl_3$ (Sigma-Aldrich, St. Louis, Mo.) gave an extinction coefficient of 9,165±148 liters/mole-cm.

LNCaP cells were cultured in RPMI 1640 medium (Sigma, St. Louis, Mo.) supplemented with 10% fetal calf serum (FCS); C4-2, PC-3, and DU-145 were cultured in T-medium with 10% FCS (Hyclone, Logan, Utah). All cells were cultured at 37° C. in a humidified 5% $CO_2$ atmosphere. Upon reaching 90% confluency, cells were collected either by detachment in 0.5% trypsin containing 0.02% EDTA or detached in cold phosphate buffered saline (PBS) using cell scrapers.

In order to determine the extent of PSMA expression in human tissues and cultured prostate cell lines, polymerase chain reaction assays were performed to measure the amount of PSMA messenger RNA produced. Total RNA was isolated from cells using the RNeasy kit (Qiagen, Valencia, Calif.). Contaminating DNA was removed by DNase I treatment (Clontech, Palo Alto, Calif.). cDNA was synthesized using AMV RT (Promega, Madison, Wis.) and random hexamer primers (Amersham, Piscataway, N.J.) in the presence of RNase inhibitor (Promega). Real-time RT-PCR was performed in a 7000 Sequence Detection System thermocycler (Applied Biosystems, Foster City, Calif.) using gene-specific primer pairs and fluorescent reporter probes (Integrated DNA Technologies, Coralville, Iowa). To avoid amplification from genomic DNA, intron-spanning primers were used (designed with Primer Express software; Applied Biosystems). The primers and probe for PSMA were: 5-tgagagactccaggactttgacaa-3 (forward), 5-ggatcaataaat-gctctttccagaa-3 (reverse), and 5-agcaacccaatagtattaagaatgat-gaatgatcaactca-3 (probe). For glyceraldehyde-3-phosphate dehydrogenase (GAPDH), commercially available reagents (Applied Biosystems) were used. 350 ng of cDNA were used in a total volume of 25 μl of PCR MasterMix containing 900 nM of the primers and 300 nM of the probe. The cycling conditions were 95° C. 10 min, 45×(95° C. 15 sec, 60° C. 1 min). No-template and non-reverse transcribed RNA controls were included. The data were analyzed using the Sequence Detection System software (Applied Biosystems). The expression differences were calculated by the $2^{-\Delta\Delta Ct}$ method for assessing relative expression (Applied Biosystems, User Bulletin #2, 2001). The signals for PSMA were normalized to the signals for GAPDH to control for RNA input. The size of the amplicons was verified in agarose gels.

Since there is often an imperfect correlation between messenger RNA amounts in cells and the amounts of the translated proteins, flow cytometry was also performed to further investigate the levels of cell surface expression of PSMA. All cells were harvested by trypsinization, centrifuged and resuspended in PBS containing 0.1% azide and 1% BSA. Cells were analyzed for cell surface expression of PSMA using either biotinylated or unconjugated MAb 3C6. Fluorescent labeling was achieved with either a fluorescein conjugate of streptavidin or with a phycoerythrin conjugate of rat anti-mouse antibody (BD Biosciences, Palo Alto, Calif.). Data were acquired using a Becton Dickinson FACscan flow cytometer equipped with a 488-nm argon laser and CellQuest software (San Jose, Calif.).

Sulfo-NHS-LC-Biotin groups were attached to primary amines of MAb 3C6 using the EZ-Link™ Sulfo-NHS-LC-Biotin kit according to the manufacturer's protocol. Conjugated MAb 3C6 was separated from low molecular weight compounds using a Millipore Ultrafree®-MC Centrifugal Filter Unit at a force of 3000 g in a fixed angle microfuge rotor. Antibody concentration was determined using the Pierce Protein Assay Reagent Kit, and the ratio of biotin/antibody was determined with a Pierce HABA colorimetric assay, both according to the manufacturer's protocol. Later experiments utilized J591, which was biotinylated using the same method as 3C6 and attached to streptavidin-conjugated SPIONs by incubation for 30 min. The free antibody was removed by washing the beads with the aid of a magnetic bead separation device (Miltenyi, Inc.).

Dynabeads® MyOne™ Streptavidin superparamagnetic beads (1.05+/−0.10 μm diameter, 26% iron oxide w/w, polystyrene coating, $1.23 \times 10^{-13}$ g Fe/bead) and μMACs® Streptavidin MicroBeads (~50 nm diameter, 57% iron oxide w/w, dextran coating, $1.67 \times 10^{-17}$ g Fe/bead) were used as contrast agents for MR imaging. The Dynabeads® solution contained detergent (0.01% Tween 20) and preservative (0.09% sodium azide), which were removed by multiple washing with phosphate buffered saline (PBS). The µMACs® solution contained 0.05% sodium azide, but no detergent, and was not washed. LNCaP and DU-145 cell suspensions were incubated with biotinylated PSMA for 30 minutes at 4° C., followed by washing with PBS. Labeled cells were incubated with the streptavidin superparamagnetic beads (10 µl bead solution/$10^7$ cells) for 30 minutes at 4° C. with gentle agitation. Cells were separated from unbound beads by repeated centrifugation at 300×g. LNCaP and DU-145 cells were each resuspended in ~100 µl low melting point 1% agarose in PBS and layered into plastic tubes as described below.

For the SPION-only samples, SPIONs at various concentrations were mixed with 1% agarose gel in 10 mm O.D. plastic tubes and MR images and relaxation rates were measured at 0.27 T, 1.0 T, 1.9 T and 4.7 T. For the SPION-labeled cells, the MRI samples were prepared with layers of SPION-labeled LNCaP and DU-145 cells, in between layers of agarose gel, in 10 mm O.D. plastic tubes, to measure the MRI signal intensities of the control DU-145 cells, the PSMA-positive LNCaP cells, and the agarose simultaneously in the same sample.

MR imaging was carried out using horizontal bore instruments at 1.0 T (MRT Systems, Tsukuba, Japan), at 1.9 T (Oxford Research), and at 4.7 T (Bruker Biospec, Billerica, Mass.). All 2D images were acquired with a 128×32 image matrix, 0.32 mm in-plane resolution, and a slice thickness of 2.5 mm. $T_2$-weighted images were acquired using spin echo imaging sequences with the echo times (TE) varying from 5.5 ms to 145.5 ms. Small echo time (TE ~4-7 ms) images were used to acquire $T_1$-weighted images by varying the repetition times (TR) from 0.3 s to 12 s. $T_1$ recovery curves were generated using a series of one-dimensional SE images with TE=10.7 ms. Regions of interest (ROIs) were selected corresponding to the SPIONs, LNCaP cells, DU-145 cells, and the agarose gel. The signal intensity S of an ROI was plotted as a function of recovery time t, and $T_1$ was determined by a 3-parameter fit of the function $S(t)=S(\infty)(1-P\exp(-T_1/t))$, where $S(\infty)$ is the fully-recovered signal intensity and P is a measure of the level of inversion achieved (P=2 for perfect inversion). Using a series of SE images with different TE values, $T_2$ decay curves were generated for each of the sample components by selecting an ROI corresponding to each component (SPIONs, LNCaP cells, DU-145 cells, and agarose gel) and plotting the mean signal intensity, S, of the ROI as a function of TE. $T_2$ was determined by fitting the decay curves with a decaying exponential, $S(TE)=S_o \exp(-TC/TE)$, where $S_o$ is the signal intensity for TE=0, and TC is the desired time constant. The relaxivities of the SPIONs were determined by themselves and bound to cells in 1% agarose gels by measuring the relaxation times ($T_1$, $T_2$) for various [Fe] values and conversion to rate enhancements ($r_1$, $r_2$) as a function of [Fe] (See FIG. 1 for an example).

The complex, time-domain MRI datasets were baseline-corrected, Fourier-transformed and co-added using Mathematica version 10.0.2 (Wolfram Research, Urbana, Ill.) to produce the frequency domain images of each MRI slice. The theoretical dependence of the image contrast on [Fe] and its inversion to produce [Fe] as a function of contrast and code to convert the MR images into [Fe] images was written in Mathematica.

Image contrast is defined as $C=(I_C/I_A-1)$, where $I_C$ is the MR signal intensity from the pixels in the region of interest including the labeled cells, and $I_A$ is the MR signal intensity of the background agarose pixels. The contrast defined can range from $+\infty$ to $-1.0$, with positive (negative) contrast indicating that the object of interest is hyperintense (hypointense) with respect to the signal from the agarose background. The average and standard deviation of the pixel intensities in the regions of interest were measured with MiraAP software (Axiom Research, Inc., Tucson, Ariz.). The errors in the computed contrast were calculated using a standard propagation-of-errors analysis based on the measured standard deviations of the pixel intensities for the cells and agarose.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiments, methods, and examples, but by all embodiments and methods within the scope and spirit of the disclosure.

What is claimed is:

1. A method of measuring the concentration of a magnetic material in an object using magnetic resonance imaging comprising the steps of:
   administering magnetic material to said object;
   obtaining a set of $T_1$-weighted and $T_2$-weighted images of the object in order to determine a background magnetic resonance imaging signal intensity and measurements of the background nuclear magnetic relaxation times ($T_1$, $T_2$) of the object without magnetic material; and
   obtaining a set of $T_1$-weighted and $T_2$-weighted magnetic resonance images of the object with magnetic materials added;
   measuring effect of magnetic material on the relaxation times; and
   converting said sets of $T_1$-weighted and $T_2$-weighted images into a set of contrast images which are subtracted from each other to yield a contrast difference image proportional to the concentration of the magnetic material.

2. The method of claim 1 wherein the difference in contrast between the $T_1$-weighted and $T_2$-weighted images is a uniformly positive, monotonic function of the magnetic material concentration.

3. The method of claim 1 wherein said $T_1$-weighted image contrast is positive and said $T_2$-weighted image contrast is negative.

4. The method of claim 1 wherein said magnetic material is iron, nickel, manganese, chromium, gallium, or a lanthanide.

5. A method of measuring the concentration of a magnetic material in an object using magnetic resonance imaging comprising the steps of:
   obtaining a set of $T_1$-weighted and $T_2$-weighted images of the object in order to determine a background magnetic resonance imaging signal intensity and measurements of the background nuclear magnetic relaxation times ($T_1$, $T_2$) of the object without magnetic material;
   administering magnetic material to said object;
   obtaining a set of $T_1$-weighted and $T_2$-weighted magnetic resonance images of the object with magnetic materials added; and
   converting said images into a set of contrast images which are subtracted from each other to yield a contrast difference image proportional to the concentration of the magnetic material.

6. The method of claim 5 wherein the difference in contrast between the $T_1$ weighted and $T_2$-weighted images is a uniformly positive, monotonic function of the magnetic material concentration.

7. The method of claim 5 wherein said magnetic material is iron, nickel, manganese, chromium, gallium, or a lanthanide.

8. The method of claim 5 wherein said $T_1$ weighted image contrast is positive and said $T_2$-weighted image contrast is negative.

9. A method of conducting non-destructive testing of an object comprising the steps of: obtaining a set of $T_1$ weighted and $T_2$-weighted images of the object in order to determine the background magnetic resonance imaging signal intensity and measurements of the background nuclear magnetic relaxation times ($T_1$, $T_2$) of the object without magnetic material;
administering magnetic particles to said object;
obtaining a set of $T_1$-weighted and $T_2$-weighted magnetic resonance images of the object with magnetic particles added; and
converting said sets of images into a set of contrast images which are subtracted from each other to yield a contrast difference image proportional to the absolute concentration of the magnetic particles.

10. The method of claim 9 wherein the difference in contrast between the $T_1$ weighted and $T_2$-weighted images is a uniformly positive, monotonic function of the magnetic material concentration.

11. The method of claim 9 wherein said $T_1$-weighted image contrast is positive and said $T_2$-weighted image contrast is negative.

12. The method of claim 9 wherein said magnetic material is iron, nickel, manganese, chromium, gallium, or a lanthanide.

13. A method of analyzing the temporal and spatial disposition of SPIONs in a region of interest of an object, comprising the steps of:
a. measuring the relaxivity of the SPIONs for both $r_1$, and $r_2$;
b. measuring the $T_1$ and $T_2$ relaxation times of the region of interest;
c. obtaining a set of control images with $T_1$ and $T_2$ to give the object signal backgrounds, $B_1$ and $B_2$, in the region of interest;
d. administering the SPIONs;
e. obtaining a set of magnetic resonance images with $T_1$ and $T_2$ weighting, to give $S_1$ and $S_2$,
f. converting said images into contrast maps using the measured $T_1$-weighted and $T_2$-weighted, backgrounds, producing $C_1$ and $C_2$ images;
g. using said difference between $C_1$ and $C_2$ images to create a $\Delta C$ image of whose intensity is proportional to the Fe concentration [Fe];
h. using the intensity of said $\Delta C$ image and the relationship between [Fe] to convert the $\Delta C$ image to an image whose voxel intensity directly gives the [Fe] within the voxel.

14. The method of claim 13 wherein the difference in contrast between the $T_1$-weighted and $T_2$-weighted images is a uniformly positive and monotonic.

15. The method of claim 13 wherein said object is a tumor.

16. The method of claim 13 wherein said $T_1$-weighted image contrast is positive and said $T_2$-weighted image contrast is negative.

17. The method of claim 13 wherein said magnetic material is iron, nickel, manganese, chromium, gallium, or a lanthanide.

18. A method of analyzing the temporal and spatial disposition of SPIONs in a region of interest of an object, comprising the steps of:
i. measuring the relaxivity of the SPIONs for both $r_1$, and $r_2$;
j. measuring the $T_1$ and $T_2$ relaxation times of the region of interest;
k. obtaining a set of control images with $T_1$ and $T_2$ to give the object signal backgrounds, $B_1$ and $B_2$, in the region of interest;
l. converting said images into contrast maps using the measured $T_1$-weighted and $T_2$-weighted, backgrounds, producing $C_1$ and $C_2$ images;
m. using said difference between $C_1$ and $C_2$ images to create a $\Delta C$ image of whose intensity is proportional to the Fe concentration [Fe];
n. using the intensity of said $\Delta C$ image and the relationship between [Fe] to convert the $\Delta C$ image to an image whose voxel intensity directly gives the [Fe] within the voxel.

19. The method of claim 18 wherein $T_1$ and $T_2$ are the longitudinal and transverse relaxation times.

20. The method of claim 18 wherein the difference in contrast between the $T_1$-weighted and $T_2$-weighted images is a uniformly positive and monotonic.

21. The method of claim 18 wherein said $T_1$-weighted image contrast is positive and said $T_2$-weighted image contrast is negative.

* * * * *